United States Patent
Lim

(10) Patent No.: US 12,379,418 B2
(45) Date of Patent: Aug. 5, 2025

(54) APPARATUS AND METHOD FOR DIAGNOSING STATE OF BATTERY

(71) Applicant: LG Energy Solution, Ltd., Seoul (KR)

(72) Inventor: Bo-Mi Lim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/027,835

(22) PCT Filed: Feb. 15, 2022

(86) PCT No.: PCT/KR2022/002244
§ 371 (c)(1),
(2) Date: Mar. 22, 2023

(87) PCT Pub. No.: WO2022/177274
PCT Pub. Date: Aug. 25, 2022

(65) Prior Publication Data
US 2024/0012058 A1    Jan. 11, 2024

(30) Foreign Application Priority Data
Feb. 19, 2021    (KR) .......... 10-2021-0022771

(51) Int. Cl.
*G01R 31/3835* (2019.01)
*G01R 31/392* (2019.01)

(52) U.S. Cl.
CPC ....... *G01R 31/3835* (2019.01); *G01R 31/392* (2019.01)

(58) Field of Classification Search
None
See application file for complete search history.

(56) References Cited

U.S. PATENT DOCUMENTS 11,923,710 B2 * 3/2024 Lim .................. G01R 31/367
12,216,168 B2 * 2/2025 Lim .................. G01R 31/392
(Continued)

FOREIGN PATENT DOCUMENTS

CN    111693882 A    9/2020
EP    4012427 A1    6/2022
(Continued)

OTHER PUBLICATIONS

Extended European Search Report including Written Opinion for Application No. 22756472.1 dated Mar. 28, 2024, pp. 1-7.
(Continued)

*Primary Examiner* — Jermele M Hollington
(74) *Attorney, Agent, or Firm* — Lerner David LLP

(57) ABSTRACT

An apparatus for diagnosing a state of a battery includes a processor and memory having programmed thereon instructions that, when executed, are configured to cause the processor to obtain plurality of differential profiles representing a corresponding relationship between a differential capacity representing a change rate of a capacity of a battery with respect to a voltage of the battery and the voltage; determine a target peak located in a predetermined voltage section in each of the plurality of differential profiles; compare a plurality of voltages of a plurality of target peaks with a plurality of voltages of a reference peaks preset to correspond to each of the plurality of target peaks, and diagnose a state of the battery based on the voltage comparison result.

12 Claims, 5 Drawing Sheets

(56) References Cited

U.S. PATENT DOCUMENTS

| | | | |
|---|---|---|---|
| 2012/0169288 A1 | 7/2012 | Ueki et al. | |
| 2012/0226455 A1 | 9/2012 | Kumashiro et al. | |
| 2017/0179739 A1* | 6/2017 | Webb | H02J 7/04 |
| 2020/0292622 A1 | 9/2020 | Wu et al. | |
| 2021/0046844 A1 | 2/2021 | Bae et al. | |
| 2022/0179008 A1* | 6/2022 | Lee | G01R 31/3835 |
| 2022/0276314 A1 | 9/2022 | Kim et al. | |
| 2023/0194620 A1* | 6/2023 | Choi | G01R 31/392 |
| | | | 702/63 |
| 2023/0258735 A1* | 8/2023 | An | H01M 10/482 |
| | | | 324/434 |
| 2023/0305065 A1* | 9/2023 | Lim | B60L 3/0046 |

FOREIGN PATENT DOCUMENTS

| | | |
|---|---|---|
| JP | H09-147926 A | 6/1997 |
| JP | 2010-093875 A | 4/2010 |
| JP | 2012-181976 A | 9/2012 |
| JP | 2013019709 A | 1/2013 |
| JP | 5354416 B1 | 11/2013 |
| JP | 2014092471 A | 5/2014 |
| JP | 2014139897 A | 7/2014 |
| JP | 2016126887 A | 7/2016 |
| JP | 2017133870 A | 8/2017 |
| JP | 2018073755 A | 5/2018 |
| JP | 2018205139 A | 12/2018 |
| JP | 201945351 A | 3/2019 |
| JP | 201996552 A | 6/2019 |
| JP | 2019110087 A | 7/2019 |
| JP | 2019158597 A | 9/2019 |
| JP | 6607167 B2 | 11/2019 |
| JP | 2020532838 A | 11/2020 |
| WO | 2011036760 A1 | 3/2011 |

OTHER PUBLICATIONS

Energsoft, "Differential capacity analysis", Energsoft Blog About AI and Batteries, Apr. 2018, 11 pgs. Retrieved from Internet: < <https://energsoft.com/blog/f/differential-capacity-analysis> >.

International Search Report for Application No. PCT/2022/002244 mailed May 27, 2022, pp. 1-3.

* cited by examiner

APPARATUS AND METHOD FOR DIAGNOSING STATE OF BATTERY

CROSS REFERENCE TO RELATED APPLICATIONS

The present application is a national phase entry under 35 U.S.C. § 371 of International Application No. PCT/KR2022/002244 filed Feb. 15, 2022 which claims priority to Korean Patent Application No. 10-2021-0022771 filed on Feb. 19, 2021 in the Republic of Korea, the disclosures of which are incorporated herein by reference.

TECHNICAL FIELD

The present disclosure relates to an apparatus and method for diagnosing a state of a battery, and more particularly, to an apparatus and method for diagnosing a state of a battery, which may diagnose a state of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

In general, these batteries may be degraded as charging or discharging is repeated. For example, at the positive electrode of the battery, the battery may be degraded since the electrolyte is oxidized or the crystal structure is destroyed. In addition, at the negative electrode of the battery, the battery may be degraded since metallic lithium is precipitated. Therefore, it is necessary to develop a technology that can diagnose the state of the battery based on the battery voltage and capacity indicators in a non-destructive manner.

SUMMARY

Technical Problem

The present disclosure is designed to solve the problems of the related art, and therefore the present disclosure is directed to providing an apparatus and method for diagnosing a state of a battery, which may diagnose a state of a battery in a non-destructive manner based on voltage and capacity of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

An apparatus for diagnosing a state of a battery according to one aspect of the present disclosure may comprise a processor and memory having programmed thereon instructions that, when executed, are configured to cause the processor to obtain a plurality of differential profiles representing a corresponding relationship between a differential capacity representing a change rate of a capacity of a battery with respect to a voltage of the battery and the voltage; determine a target peak located in a predetermined voltage section in each of the plurality of differential profiles; and compare a plurality of voltages of a plurality of target peaks with a plurality of voltages of reference peaks preset to correspond to each of the plurality of target peaks, and diagnose a state of the battery based on the voltage comparison result.

The instructions are configured to diagnose the state of the battery as an abnormal state, when the voltage of at least one of the plurality of target peaks is less than the voltage of the corresponding reference peak.

The instructions are configured to set a criterion peak among the plurality of target peaks, and calculate a voltage change rate for each of the plurality of targets based on a voltage of the set criterion peak.

The instructions are configured to calculate a reference change rate for each of a plurality of reference peaks based on the voltage of a reference peak corresponding to the set criterion peak among the plurality of reference peaks corresponding to the plurality of target peaks.

The instructions are configured to compare the voltage change rate and the reference change rate corresponding to each other based on the corresponding relationship between the plurality of target peaks and the plurality of reference peaks, and diagnose the state of the battery based on the change rate comparison result and the voltage comparison result.

The instructions are configured to diagnose the state of the battery as an abnormal state, when the voltage and the voltage change rate of at least one of the plurality of target peaks are respectively less than the voltage and the reference change rate of the reference peak.

The instructions are configured to obtain a differential profile for the battery at a plurality of time points different from each other.

The plurality of time points may be a plurality of cycle time points or a plurality of degradation time points for the battery.

A battery pack according to another aspect of the present disclosure may comprise the apparatus for diagnosing a state of a battery according to an aspect of the present disclosure.

A method for diagnosing a state of a battery according to another aspect of the present disclosure may comprise: obtaining, by a processor, a plurality of differential profiles representing a corresponding relationship between a differential capacity representing a change rate of a capacity of a battery with respect to a voltage of the battery and the voltage; determining, by the processor, a target peak located in a predetermined voltage section in each of the plurality of differential profiles; comparing, by the processor, a plurality of voltages of a plurality of target peaks with a plurality of voltages of reference peaks preset to correspond to each of the plurality of target peaks; and diagnosing, by the processor, a state of the battery based on the voltage comparison result.

Advantageous Effects

According to one aspect of the present disclosure, there is an advantage that the state of the battery can be diagnosed based on the differential profile of the battery. In particular, there is an advantage that a battery having with the possibility of a sudden drop in SOH (State of Health) can be diagnosed based on the voltage and/or voltage change rate of the target peak included in the differential profile.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
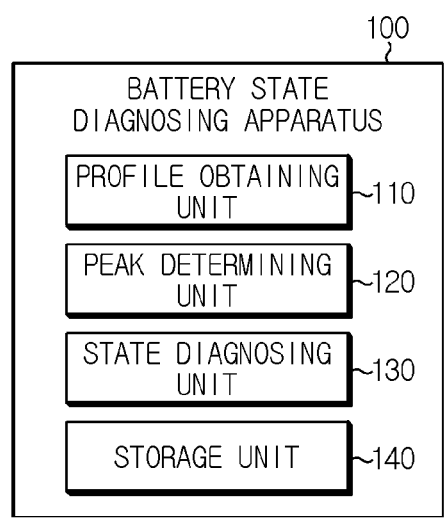
FIG. 1 is a diagram schematically showing an apparatus for diagnosing a state of a battery according to an embodiment of the present disclosure.

FIG. 1 is a diagram schematically showing an apparatus 100 for diagnosing a state of a battery according to an embodiment of the present disclosure.

Referring to FIG. 1, the apparatus 100 for diagnosing a state of a battery according to an embodiment of the present disclosure may include a profile obtaining unit 110, a peak determining unit 120, and a state diagnosing unit 130.

Here, the battery refers to one physically separable independent cell having a negative electrode terminal and a positive electrode terminal. For example, a lithium-ion battery or a lithium polymer cell may be regarded as the battery.

The profile obtaining unit 110 may be configured to obtain a plurality of differential profiles representing a corresponding relationship between a differential capacity representing a change rate of a capacity of a battery with respect to a voltage of the battery and the voltage.

Here, the differential capacity is a value representing the change rate of the capacity of the battery with respect to the voltage of the battery, and may be expressed as dQ/dV.

For example, the profile obtaining unit 110 may obtain a plurality of differential profiles representing a corresponding relationship between the differential capacity and voltage of the battery. As another example, the profile obtaining unit 110 may obtain a plurality of battery profiles representing a corresponding relationship between voltage and capacity of the battery, and obtain a differential profile by calculating a differential capacity of the battery based on each of the plurality of obtained battery profiles.

Preferably, the profile obtaining unit 110 may be configured to obtain a differential profile for the battery at a plurality of time points different from each other.

For example, the plurality of time points may be a plurality of cycle time points or a plurality of degradation time points for the battery. That is, the profile obtaining unit 110 may obtain a differential profile for a plurality of State of Health (SOH) of the battery. Here, the SOH is an index representing the state of health of the battery, and the SOH of a Beginning of Life (BOL) battery may be 1. In addition, as the battery is degraded, the SOH of the battery may be lowered.

Figure 2:
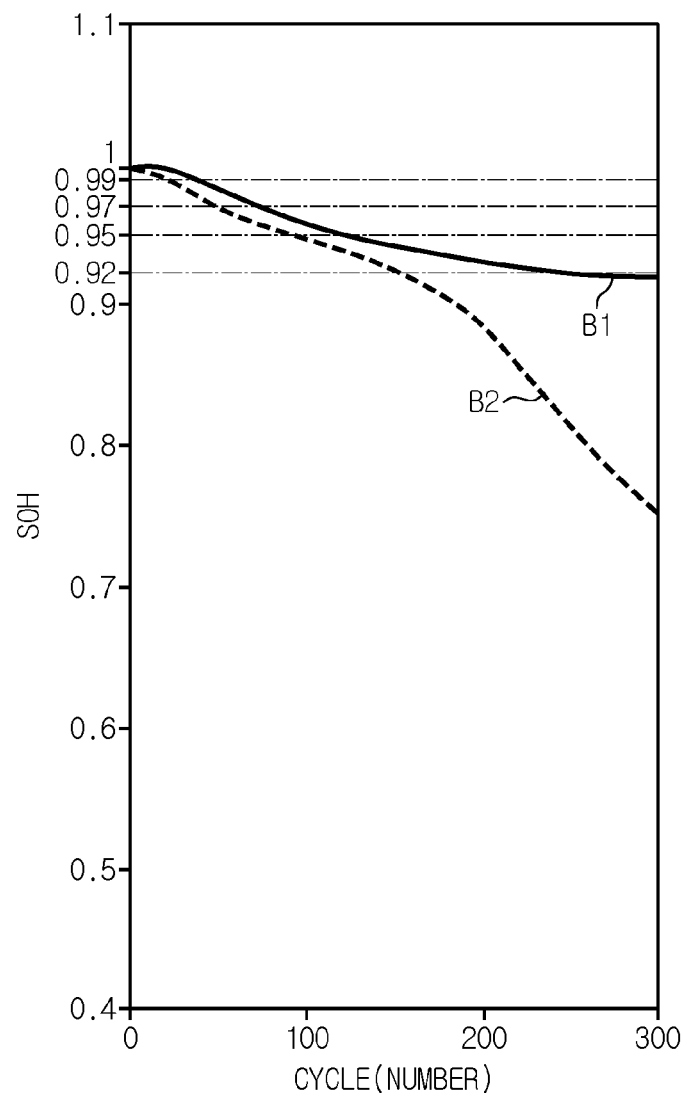
FIG. 2 is a diagram schematically showing a SOH for a first battery and a second battery according to an embodiment of the present disclosure.

FIG. 2 is a diagram schematically showing a SOH for a first battery B1 and a second battery B2 according to an embodiment of the present disclosure.

In the embodiment of FIG. 2, the first battery B1 and the second battery B2 may be degraded as the cycle progresses, so that the SOH may be reduced. That is, the first battery B1 and the second battery B2 may be degraded as the charging and discharging cycle proceeds.

However, the SOH of the first battery B1 may decrease gradually as the cycle progresses, whereas the SOH of the second battery B2 may decrease rapidly as the cycle progresses. That is, the first battery B1 may be a reference battery in which the SOH does not suddenly drop. In addition, the second battery B2 is a battery whose state is to be diagnosed, and may be an abnormal battery in which the SOH suddenly drops around 150 cycles.

For example, in the embodiment of FIG. 2, the profile obtaining unit 110 may obtain differential profiles at time points where the SOH of the second battery B2 is 0.99, 0.97, 0.95 and 0.92. That is, the profile obtaining unit 110 may obtain a differential profile for the second battery B2 at a plurality of time points according to the SOH of the second battery B2.

Preferably, the differential profile for the first battery B1 corresponding to the reference battery may be stored in advance in a storage unit 140, and the profile obtaining unit 110 may obtain a differential profile for the second battery B2 that is the target of state diagnosis.

FIGS. 3 to 6 are diagrams showing differential profiles for the first battery B1 and the second battery B2 according to an embodiment of the present disclosure. Specifically, FIGS. 3 to 6 are diagrams showing differential profiles at first to fourth time points according to the SOH of the first battery B1 and the second battery B2.

Figure 3:
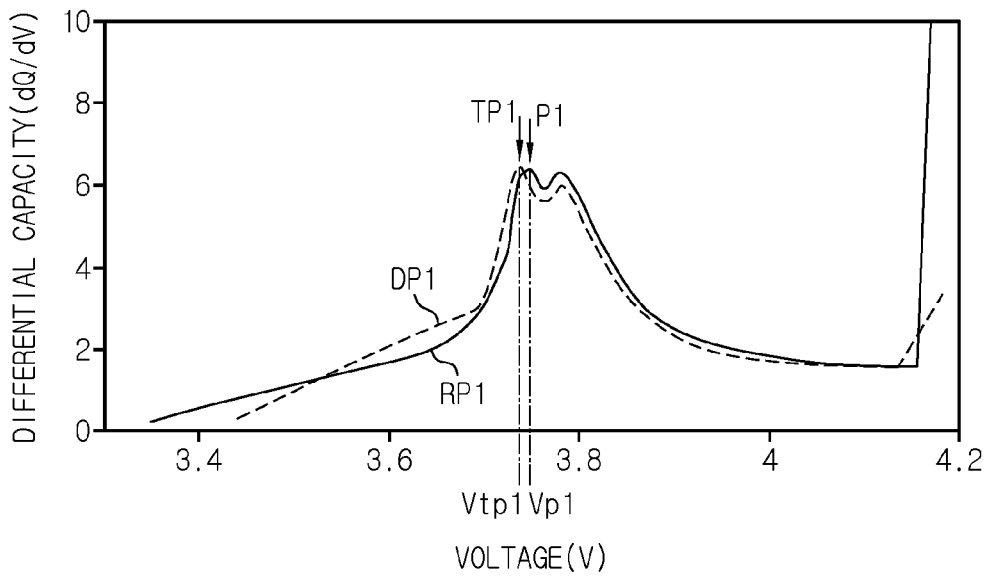
FIGS. 3 to 6 are diagrams showing differential profiles for the first battery and the second battery according to an embodiment of the present disclosure.

FIG. 3 is a diagram showing a first differential profile RP1 for the first battery B1 and a first differential profile DP1 for the second battery B2 at the first time point where the SOH of the first battery B1 and the second battery B2 is 0.99.

Figure 4:
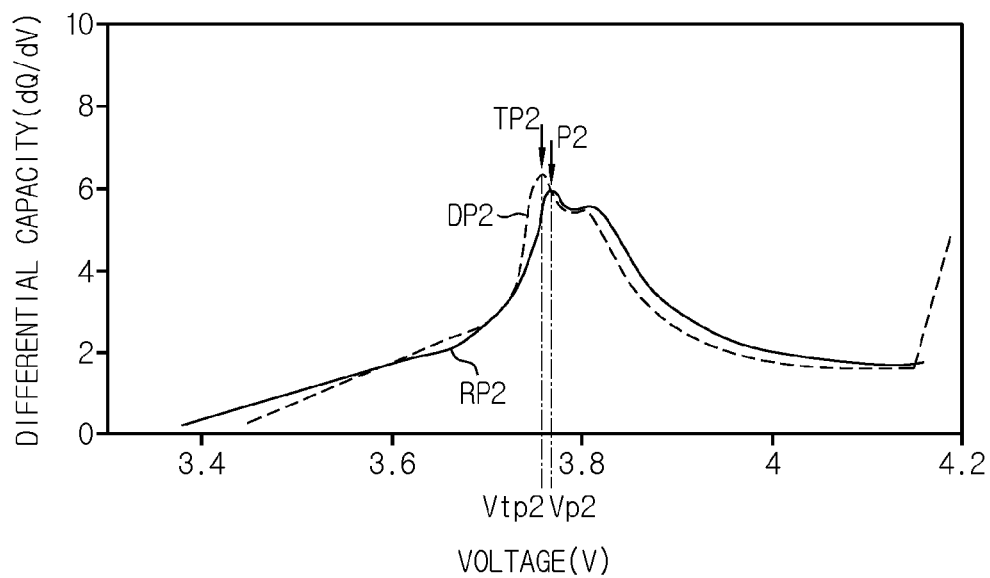

FIG. 4 is a diagram showing a second differential profile RP2 for the first battery B1 and a second differential profile DP2 for the second battery B2 at the second time point where the SOH of the first battery B1 and the second battery B2 is 0.97.

Figure 5:
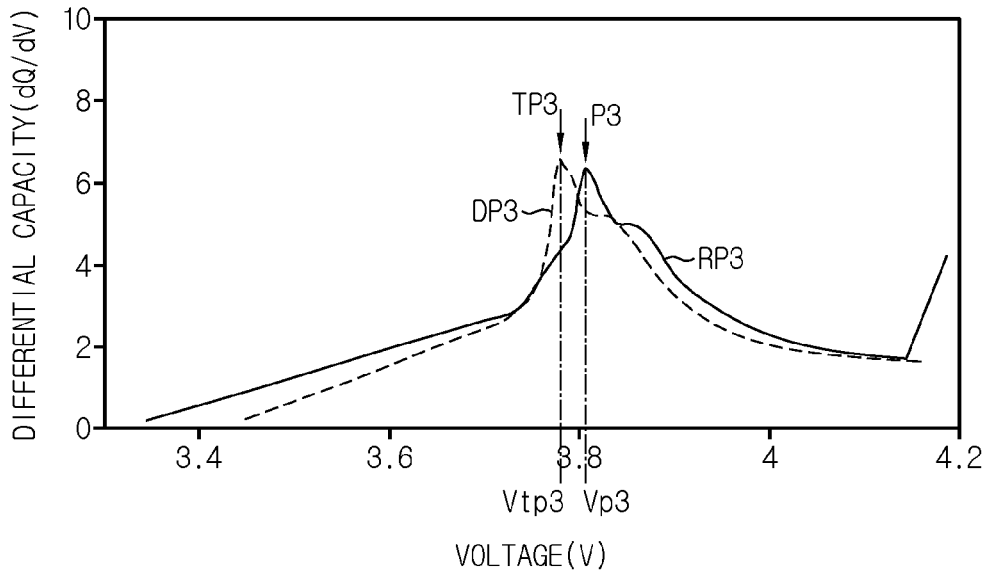

FIG. 5 is a diagram showing a third differential profile RP3 for the first battery B1 and a third differential profile DP3 for the second battery B2 at the third time point where the SOH of the first battery B1 and the second battery B2 is 0.95.

Figure 6:
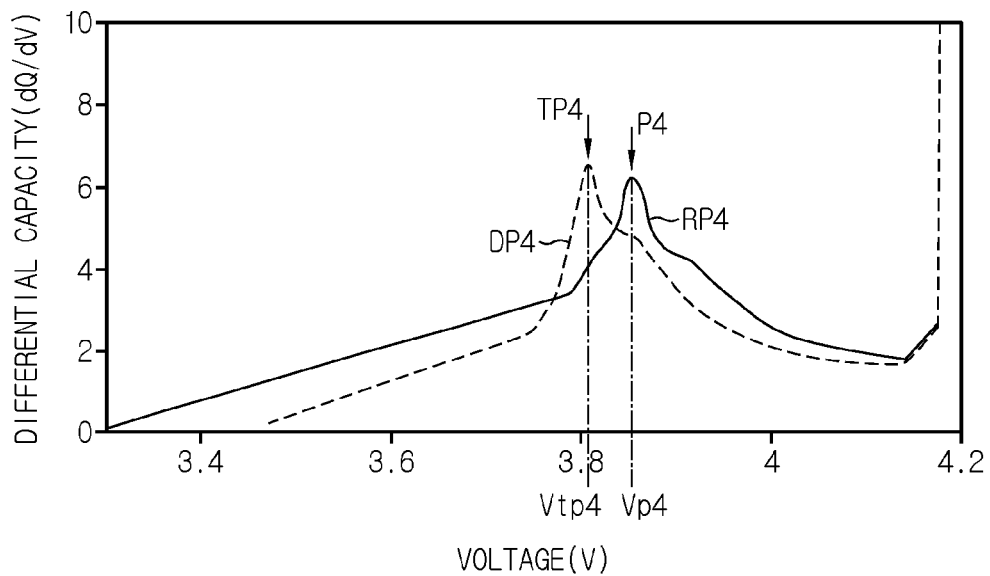

FIG. 6 is a view showing a fourth differential profile RP4 for the first battery B1 and a fourth differential profile DP4 for the second battery B2 at the fourth time point where the SOH of the first battery B1 and the second battery B2 is 0.92.

Referring to the embodiment of FIG. 2, the differential profile of the first battery B1 and the differential profile of the second battery B2 may be obtained at a time point where the first battery B1 and the second battery B2 have the same SOH.

The peak determining unit 120 may be configured to determine a target peak located in a predetermined voltage section in each of the plurality of differential profiles.

Specifically, the predetermined voltage section may be a partial section located in the center portion of a voltage section that is set to be operable for the battery. For example, it is assumed that the total voltage section set to be operable for the battery is 3.3 V or more and 4.2 V or less. In this case, the predetermined voltage section may be a 3.6 V to 3.9 V section among the entire voltage section.

For example, the peak determining unit 120 may determine a point having the largest differential capacity among points at which the differential capacity is 0 in the predetermined voltage section as the peak of the corresponding differential profile.

In the embodiment of FIG. 3, the peak determining unit 120 may determine a first target peak TP1 in the first differential profile DP1 for the second battery B2. The voltage corresponding to the first target peak TP1 may be Vtp1. Meanwhile, the first differential profile RP1 of the first battery B1 may include a first reference peak P1 corresponding to the first target peak TP1. In addition, the voltage corresponding to the first reference peak P1 may be Vp1.

In the embodiment of FIG. 4, the peak determining unit 120 may determine a second target peak TP2 in the second differential profile DP2 for the second battery B2. The voltage corresponding to the second target peak TP2 may be Vtp2. Meanwhile, the second differential profile RP2 of the first battery B1 may include a second reference peak P2 corresponding to the second target peak TP2. In addition, the voltage corresponding to the second reference peak P2 may be Vp2.

In the embodiment of FIG. 5, the peak determining unit 120 may determine a third target peak TP3 in the third differential profile DP3 for the second battery B2. The voltage corresponding to the third target peak TP3 may be Vtp3. Meanwhile, the third differential profile RP3 of the first battery B1 may include a third reference peak P3 corresponding to the third target peak TP3. In addition, the voltage corresponding to the third reference peak P3 may be Vp3.

In the embodiment of FIG. 6, the peak determining unit 120 may determine a fourth target peak TP4 in the fourth differential profile DP4 for the second battery B2. The voltage corresponding to the fourth target peak TP4 may be Vtp4. Meanwhile, the fourth differential profile RP4 of the first battery B1 may include a fourth reference peak P4 corresponding to the fourth target peak TP4. In addition, the voltage corresponding to the fourth reference peak P4 may be Vp4.

The state diagnosing unit 130 may be configured to compare the voltage of the plurality of target peaks determined by the peak determining unit 120 with the voltage of the reference peak preset to correspond to each of the plurality of target peaks.

Specifically, the state diagnosing unit 130 may compare the magnitudes of the voltage of the plurality of target peaks and the voltage of the corresponding reference peak directly.

For example, the state diagnosing unit 130 may compare the magnitudes of the voltages of the first target peak TP1 and the first reference peak P1 and may compare the magnitudes of the voltages of the second target peak TP2 and the second reference peak P2. In addition, the state diagnosing unit 130 may compare the magnitudes of the voltages of the third target peak TP3 and the third reference peak P3 and may compare the magnitudes of the voltages of the fourth target peak TP4 and the fourth reference peak P4.

The state diagnosing unit 130 may be configured to diagnose the state of the battery based on the voltage comparison result.

Specifically, the state diagnosing unit 130 may be configured to diagnose the state of the battery as an abnormal state, when the voltage of at least one of the plurality of target peaks is less than the voltage of the corresponding reference peak.

As described above, the abnormal state means a state in which the SOH of the battery suddenly drops as the battery is degraded. For example, when the state of the battery is diagnosed as an abnormal state, it means that the SOH of the battery may suddenly drop.

For example, in the embodiment of FIG. 3, the voltage Vtp1 of the first target peak TP1 may be less than the voltage Vp1 of the first reference peak P1. Similarly, in the embodiment of FIG. 4, the voltage Vtp2 of the second target peak TP2 may be less than the voltage Vp2 of the second reference peak P2. In addition, in the embodiment of FIG. 5, the voltage Vtp3 of the third target peak TP3 may be less than the voltage Vp3 of the third reference peak P3. Also, in the embodiment of FIG. 6, the voltage Vtp4 of the fourth target peak TP4 may be less than the voltage Vp4 of the fourth reference peak P4.

Accordingly, the state diagnosing unit 130 may diagnose the state of the second battery B2 as an abnormal state. That is, since the voltage of the target peak corresponding to the second battery B2 is smaller than the voltage of the reference peak corresponding to the first battery B1, the state diagnosing unit 130 may diagnose the state of the second battery B2 as an abnormal state in which the SOH may suddenly drop.

That is, the apparatus 100 for diagnosing a state of a battery according to an embodiment of the present disclosure has an advantage of rapidly diagnosing the state of the battery by comparing the voltage corresponding to the target peak of the battery with the voltage corresponding to the reference peak of the reference battery. In particular, the apparatus 100 for diagnosing a state of a battery has an advantage of rapidly diagnosing a battery with a risk of sudden drop according to the result of comparing the voltages of the reference peak and the target peak.

Meanwhile, the apparatus 100 for diagnosing a state of a battery may optionally include processors known in the art, such as an application-specific integrated circuit (ASIC), another chipset, a logic circuit, a register, a communication modem, and a data processing device, and the like, known in the art to execute various control logics disclosed below. In addition, when the control logic is implemented in software, the apparatus 100 for diagnosing a state of a battery may be implemented as a set of program modules.

In addition, the apparatus 100 for diagnosing a state of a battery may further include a storage unit 140. The storage unit 140 may store programs, data and the like required for diagnosing a state of a battery according to the present disclosure. That is, the storage unit 140 may store data necessary for operation and function of each component of the apparatus 100 for diagnosing a state of a battery, data generated in the process of performing the operation or function, or the like. The storage unit 140 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 140 may store program codes in which processes executable by each component of the apparatus 100 for diagnosing a state of a battery are defined.

For example, the storage unit 140 may store a plurality of differential profiles for the battery. In this case, the profile obtaining unit 110 may access the storage unit 140 to obtain the plurality of differential profiles for the battery.

As another example, the storage unit 140 may store a plurality of battery profiles for the battery. In this case, the profile obtaining unit 110 may access the storage unit 140 to obtain the plurality of battery profiles for the battery and obtain a plurality of differential profiles based on the plurality of obtained battery profiles.

In another embodiment, the state diagnosing unit 130 may be configured to set a criterion peak among the plurality of target peaks.

For example, the state diagnosing unit 130 may set a target peak having the lowest degree of degradation of the corresponding battery among the plurality of target peaks as a criterion peak. Specifically, the state diagnosing unit 130 may set a target peak having the lowest voltage as a criterion peak.

For example, referring to FIGS. 3 to 6, the state diagnosing unit 130 may set the first target peak TP1 having the lowest corresponding voltage as the criterion peak among the first target peak TP1, the second target peak TP2, the third target peak TP3 and the fourth target peak TP4.

The state diagnosing unit 130 may be configured to calculate a voltage change rate for each of the plurality of targets based on the voltage of the set criterion peak.

For example, the state diagnosing unit 130 may calculate a voltage change rate for each of the second target peak TP2, the third target peak TP3 and the fourth target peak TP4 based on the voltage of the criterion peak TP1. Here, since the voltage change rate for the first target peak TP1 is 0, it is assumed that the voltage change rate for the first target peak TP1 can be omitted. Specifically, the state diagnosing unit 130 may calculate the voltage change rate according to the formula of "(the voltage of the $n^{th}$ target peak−the voltage of the criterion peak)÷the voltage of the criterion peak" or "the voltage of the $n^{th}$ target peak−the voltage of the criterion peak". Here, n is a positive number.

In addition, the state diagnosing unit 130 may be configured to calculate a reference change rate for each of the plurality of reference peaks based on the voltage of a reference peak corresponding to the set criterion peak among the plurality of reference peaks corresponding to the plurality of target peaks.

For example, the state diagnosing unit 130 may calculate a reference change rate for each of the second reference peak P2, the third reference peak P3 and the fourth reference peak P4 based on the voltage of the first reference peak P1 corresponding to the criterion peak TP1. Here, since the reference change rate for the first reference peak P1 is it is assumed that the reference change rate for the first reference peak P1 can be omitted. Here, the state diagnosing unit 130 may calculate the reference change rate for each of the reference peaks by applying the method of calculating the voltage change rate of the target peak to the plurality of reference peaks.

Meanwhile, since the reference peak is preset, the reference change rate for the plurality of reference peaks may also be preset.

The state diagnosing unit 130 may be configured to compare the voltage change rate and the reference change rate corresponding to each other based on the corresponding relationship between the plurality of target peaks and the plurality of reference peaks.

For example, the state diagnosing unit 130 may compare a second voltage change rate for the second target peak TP2 with a second reference change rate for the second reference peak P2. In addition, the state diagnosing unit 130 may compare a third voltage change rate for the third target peak TP3 with a third reference change rate for the third reference peak P3. In addition, the state diagnosing unit 130 may compare a fourth voltage change rate for the fourth target peak TP4 with a fourth reference change rate for the fourth reference peak P4.

The state diagnosing unit 130 may be configured to diagnose the state of the battery based on the change rate comparison result and the voltage comparison result.

Specifically, the state diagnosing unit 130 may be configured to diagnose the state of the battery as abnormal, when the voltage and the voltage change rate of at least one of the plurality of target peaks are respectively less than the voltage and the reference change rate of the corresponding reference peak.

That is, the state diagnosing unit 130 may diagnose the state of the battery by further considering the voltage change rate as well as the voltages of the plurality of target peaks and the plurality of reference peaks.

Specifically, when the voltage change rate for the target peak of the second battery B2 is less than the reference change rate for the criterion peak of the corresponding first battery B1 and the voltage of the target peak of the second battery B2 is less than the voltage for the criterion peak of the corresponding first battery B1, the state diagnosing unit 130 may diagnose the state of the second battery B2 as an abnormal state.

For example, referring to the embodiments of FIGS. 3 and 4, the voltage Vtp2 for the second target peak TP2 may be less than the voltage Vp2 for the second reference peak P2. However, the voltage change rate for the second target peak TP2 may be greater than the reference change rate for the second reference peak P2. Accordingly, the state diagnosing unit 130 may not diagnose the state of the second battery B2 as an abnormal state based on the embodiments of FIGS. 3 and 4.

As another example, referring to the embodiments of FIGS. 3 and 5, the voltage Vtp3 for the third target peak TP3 may be less than the voltage Vp3 for the third reference peak P3. In addition, the voltage change rate for the third target peak TP3 may be less than the reference change rate for the third reference peak P3. Similarly, referring to the embodiment of FIGS. 3 and 6, the voltage Vtp4 for the fourth target peak TP4 may be less than the voltage Vp4 for the fourth reference peak P4. In addition, the voltage change rate for the fourth target peak TP4 may be less than the reference change rate for the fourth reference peak P4. Accordingly, the state diagnosing unit 130 may diagnose the state of the second battery B2 as an abnormal state based on the embodiments of FIGS. 3, 5 and 6.

The apparatus 100 for diagnosing a state of a battery according to an embodiment of the present disclosure has an advantage of more accurately diagnosing the state of the battery by further considering the voltage change rate as well as the voltage of the battery. In particular, the apparatus 100 for diagnosing a state of a battery has an advantage of specifically diagnosing the state of an abnormal battery with the possibility of sudden drop of SOH based on the voltage and the voltage change rate of the battery. Therefore, even if the SOH of the battery is not continuously tracked during the life span of the battery, a battery with a risk of sudden drop of SOH can be conveniently selected.

More specifically, the state diagnosing unit 130 may determine an increase/decrease pattern of the voltage change rate corresponding to the plurality of target peaks. In addition, when the determined increase/decrease pattern is an increase pattern and the voltage and the voltage change rate of at least one of the plurality of target peaks are respectively less than the voltage and the reference change rate of the corresponding reference peak, the state diagnosing unit 130 may be configured to diagnose the state of the battery as an abnormal state.

For example, in the embodiments of FIGS. 3 to 6, the voltages corresponding to the first to fourth target peaks TP1 to TP4 may be increased as the second battery B2 is degraded. That is, as time elapses to the second time point (SOH 0.97 time point), the third time point (SOH 0.95 time point) and the fourth time point (SOH 0.92 time point), the voltage change rate of the second battery B2 may gradually increase. Accordingly, the state diagnosing unit 130 may determine the increase/decrease pattern of the voltage change rate for the second battery B2 as an increase pattern.

Then, the state diagnosing unit 130 may compare the voltage and the voltage change rate of at least one of the plurality of target peaks for the second battery B2 with the voltage and the reference change rate of the reference peak, and diagnose the state of the second battery B2 based on the comparison result As in the example described above, the voltage Vtp3 for the third target peak TP3 may be less than the voltage Vp3 for the third reference peak P3, and the voltage Vtp4 for the fourth target peak TP4 may be less than the voltage Vp4 for the fourth reference peak P4. In addition, the voltage change rate for the third target peak TP3 may be less than the reference change rate for the third reference peak P3, and the voltage change rate for the fourth target peak TP4 may be less than the reference change rate for the fourth reference peak P4.

Accordingly, the state diagnosing unit 130 may diagnose the state of the second battery B2 as an abnormal state.

That is, the apparatus 100 for diagnosing a state of a battery according to an embodiment of the present disclosure has an advantage of diagnosing the state of the battery more rapidly since the target peak and the reference peak are specifically compared after considering the increase/decrease pattern of the voltage change rate for the battery first. In particular, when the voltage change rate for the battery is determined by an increase pattern, the apparatus 100 for diagnosing a state of a battery may judge that the degradation of the battery is gradually accelerating, and only in this case, it is possible to diagnose the state of the battery more rapidly and accurately by diagnosing whether the battery is a battery with the possibility of sudden drop.

The apparatus 100 for diagnosing a state of a battery according to the present disclosure may be applied to a BMS (Battery Management System). That is, the BMS according to the present disclosure may include the above-described apparatus 100 for diagnosing a state of a battery. In this configuration, at least some of the components of the apparatus 100 for diagnosing a state of a battery may be implemented by supplementing or adding functions of the configuration included in a conventional BMS. For example, the profile obtaining unit 110, the peak determining unit 120, the state diagnosing unit 130 and the storage unit 140 of the apparatus 100 for diagnosing a state of a battery may be implemented as components of the BMS.

In addition, the apparatus 100 for diagnosing a state of a battery according to the present disclosure may be provided to a battery pack 1. For example, the battery pack 1 according to the present disclosure may include the apparatus 100 for diagnosing a state of a battery as described above, a measuring unit 200 and at least one battery cell B. In addition, the battery pack 1 may further include electrical equipment (a relay, a fuse, etc.), a case, and the like.

Figure 7:
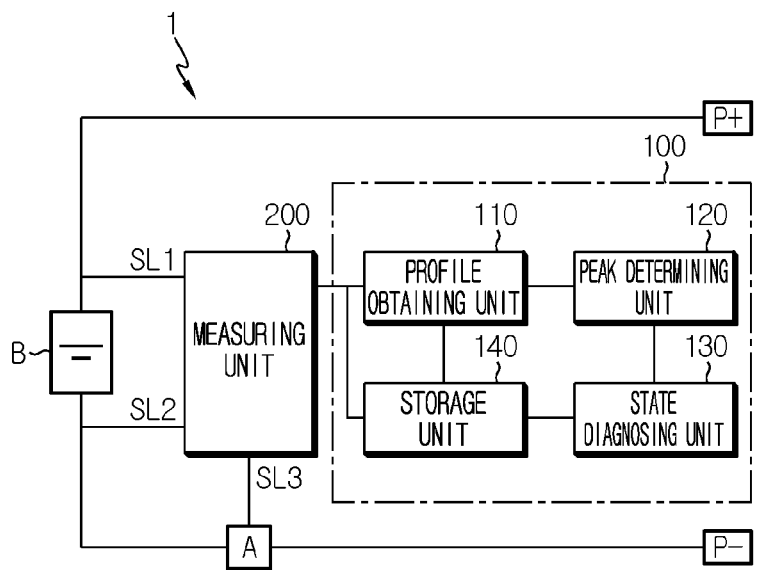
FIG. 7 is a diagram schematically showing an exemplary configuration of a battery pack according to another embodiment of the present disclosure.

FIG. 7 is a diagram schematically showing an exemplary configuration of a battery pack 1 according to another embodiment of the present disclosure.

The measuring unit 200 may be connected to a first sensing line SL1, a second sensing line SL2, and a third sensing line SL3.

Specifically, the first sensing line SL1 may be connected to a positive electrode of the battery B and the measuring unit 200. Also, the second sensing line SL2 may be connected to a negative electrode of the battery B and the measuring unit 200. The measuring unit 200 may measure the voltage of the battery B by calculating the difference between the positive electrode voltage of the battery B measured through the first sensing line SL1 and the negative electrode voltage of the battery B measured through the second sensing line SL2.

Also, the measuring unit 200 may measure a charging current and/or a discharging current of the battery B through a current measuring unit A connected to the third sensing line SL3. For example, the current measuring unit A may be a shunt resistor or an ampere meter.

The voltage and current of the battery B measured by the measuring unit 200 may be transmitted to the apparatus 100 for diagnosing a state of a battery.

For example, the profile obtaining unit 110 may receive the voltage and current of the battery B from the measuring unit 200. The profile obtaining unit 110 may generate a differential profile representing a corresponding relationship between the voltage and the differential capacity of the battery B based on the received voltage and current of the battery B.

As another example, the storage unit 140 may receive and store the voltage and current of the battery B from the measuring unit 200. The profile obtaining unit 110 may access the storage unit 140 to obtain the battery profile for the voltage and current of the battery B, and generate a differential profile based on the obtained battery profile.

As another example, the profile obtaining unit 110 may directly receive a differential profile representing a corresponding relationship between the differential capacity and the voltage of the battery B from the measuring unit 200.

Figure 8:
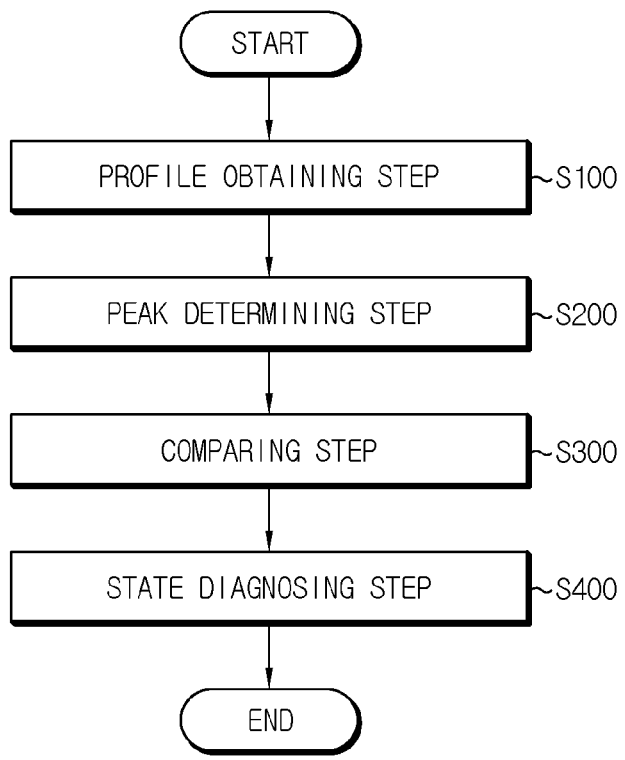
FIG. 8 is a diagram schematically showing a method for diagnosing a state of a battery according to another embodiment of the present disclosure.

FIG. 8 is a diagram schematically showing a method for diagnosing a state of a battery according to another embodiment of the present disclosure.

Preferably, each step of the method for diagnosing a state of a battery may be performed by the apparatus 100 for diagnosing a state of a battery. Hereinafter, content overlapping with the previously described content will be omitted or briefly described.

Referring to FIG. 8, the method for diagnosing a state of a battery according to still another embodiment of the present disclosure may include a profile obtaining step (S100), a peak determining step (S200), a comparing step (S300) and a state diagnosing step (S400).

The profile obtaining step (S100) is a step of obtaining a plurality of differential profiles representing a corresponding relationship between a differential capacity representing a change rate of a capacity of a battery with respect to a voltage of the battery and the voltage, and may be performed by the profile obtaining unit 110.

For example, in the embodiments of FIGS. 3 to 6, the profile obtaining unit 110 may obtain a plurality of differential profiles for the second battery B2.

The peak determining step (S200) is a step of determining a target peak located in a predetermined voltage section in each of the plurality of differential profiles and may be performed by the peak determining unit 120.

For example, in the embodiments of FIGS. 3 to 6, the peak determining unit 120 may determine a target peak in each of the plurality of differential profiles for the second battery B2. Specifically, the peak determining unit 120 may determine a first target peak TP1 in the first differential profile DP1 and determine a second target peak TP2 in the second differential profile DP2. In addition, the peak determining unit 120 may determine a third target peak TP3 in the third differential profile DP3 and determine a fourth target peak TP4 in the fourth differential profile DP4.

The comparing step (S300) is a step of comparing the voltage of the plurality of target peaks determined in the peak determining step (S200) with a voltage of a reference peak preset to correspond to each of the plurality of target peaks, may be performed by the state diagnosing unit 130.

For example, the state diagnosing unit 130 may compare the voltages and/or the voltage change rates of the target peak and the reference peak corresponding to each other.

The state diagnosing step (S400) is a step of diagnosing a state of the battery based on the voltage comparison result of the comparing step (S300) and may be performed by the state diagnosing unit 130.

For example, the state diagnosing unit 130 may diagnose the state of the battery with the possibility of sudden drop of SOH as an abnormal state based on the comparison result.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: apparatus for diagnosing a state of a battery
110: profile obtaining unit
120: peak determining unit
130: state diagnosing unit
140: storage unit
200: measuring unit
B: battery

What is claimed is:

1. An apparatus for diagnosing a state of a battery, comprising:
   a processor; and
   memory having programmed thereon instructions that, when executed, are configured to cause the processor to:
   obtain a plurality of differential profiles representing a corresponding relationship between a differential capacity representing a change rate of a capacity of the battery with respect to a voltage of the battery and the voltage;
   determine a target peak located in a predetermined voltage section in each of the plurality of differential profiles; and
   compare each of a plurality of voltages of a plurality of target peaks with a respective voltage of a plurality of voltages of reference peaks preset to correspond to each of the plurality of target peaks, and
   diagnose the state of the battery based on the voltage comparison result.

2. The apparatus for diagnosing the state of the battery according to claim 1,
   wherein the instructions are configured to diagnose the state of the battery as an abnormal state, in response to a voltage of at least one of the plurality of target peaks being less than a voltage of the corresponding reference peak.

3. The apparatus for diagnosing the state of the battery according to claim 1, wherein the instructions are configured to set a criterion peak among the plurality of target peaks, and calculate a voltage change rate for each of the plurality of targets based on a voltage of the set criterion peak.

4. The apparatus for diagnosing the state of the battery according to claim 3,
wherein the instructions are configured to calculate a reference change rate for each of a plurality of reference peaks based on the voltage of a reference peak corresponding to the set criterion peak among the plurality of reference peaks corresponding to the plurality of target peaks.

5. The apparatus for diagnosing the state of the battery according to claim 4,
wherein the instructions are configured to compare the voltage change rate and the reference change rate corresponding to each other based on the corresponding relationship between the plurality of target peaks and the plurality of reference peaks, and diagnose the state of the battery based on the change rate comparison result and the voltage comparison result.

6. The apparatus for diagnosing the state of the battery according to claim 5,
wherein the instructions are configured to diagnose the state of the battery as an abnormal state, when the voltage and the voltage change rate of at least one of the plurality of target peaks are respectively less than the voltage and the reference change rate of the reference peak.

7. The apparatus for diagnosing the state of the battery according to claim 1,
wherein the instructions are configured to obtain a differential profile for the battery at a plurality of time points different from each other.

8. The apparatus for diagnosing the state of the battery according to claim 7,
wherein the plurality of time points are a plurality of cycle time points or a plurality of degradation time points for the battery.

9. A battery pack, comprising the apparatus for diagnosing the state of the battery according to claim 1.

10. A method for diagnosing a state of a battery, comprising:
obtaining, by a processor, a plurality of differential profiles representing a corresponding relationship between a differential capacity representing a change rate of a capacity of the battery with respect to a voltage of the battery and the voltage;
determining, by the processor, a target peak located in a predetermined voltage section in each of the plurality of differential profiles;
comparing, by the processor, each of a plurality of voltages of a plurality of target peaks with a respective voltage of a plurality of voltages of reference peaks preset to correspond to each of the plurality of target peaks; and
diagnosing, by the processor, the state of the battery based on the voltage comparison result.

11. The apparatus for diagnosing the state of the battery according to claim 1,
wherein each of the plurality of differential profiles is obtained when the battery has a respective state of health (SOH) of a plurality of SOHs.

12. The method for diagnosing the state of the battery according to claim 10,
wherein each of the plurality of differential profiles is obtained when the battery has a respective state of health (SOH) of a plurality of SOHs.

* * * * *